United States Patent [19]

Tuckerman

[11] Patent Number: 5,017,509

[45] Date of Patent: May 21, 1991

[54] STAND-OFF TRANSMISSION LINES AND METHOD FOR MAKING SAME

[75] Inventor: David B. Tuckerman, Livermore, Calif.

[73] Assignee: Regents of the University of California, Oakland, Calif.

[21] Appl. No.: 555,814

[22] Filed: Jul. 18, 1990

Related U.S. Application Data

[63] Continuation of Ser. No. 221,395, Jul. 19, 1988, abandoned.

[51] Int. Cl.$^5$ ............ H01L 21/44

[52] U.S. Cl. ............ 437/182; 437/190; 437/195; 437/962

[58] Field of Search ............ 437/187, 189, 190, 203, 437/944, 962, 195, 182

[56] References Cited

U.S. PATENT DOCUMENTS 3,769,619 10/1973 Ang et al. .
4,224,361 9/1980 Romankiw ............ 437/190
4,267,632 5/1981 Shappir ............ 437/195
4,373,251 2/1983 Wilting ............ 437/195
4,464,459 8/1984 Majima et al. ............ 437/195
4,620,898 11/1986 Banks et al. ............ 156/646
4,697,333 10/1989 Nakahara ............ 437/20
4,789,645 12/1988 Calviello et al. ............ 437/195

FOREIGN PATENT DOCUMENTS 0000734 1/1985 Japan .

OTHER PUBLICATIONS

Circuits, Interconnections, and Packaging for VLSI, by H. B. Bakoglu, 1990, pp. 10–12, 208–209 and 226–227.
*Physics of Semiconductor Devices*, by S. M. Sze, p. 32.
"Design and Layout of Microstrip Structures", by F. E. Gardiol, IEE Proceedings, vol. 135, Pt. II, No. 3, June 1988, pp. 145–157.

*Primary Examiner*—Olik Chaudhuri
*Assistant Examiner*—Andrew Griffis
*Attorney, Agent, or Firm*—Henry P. Sartorio

[57] ABSTRACT

Standoff transmission lines in an integrated circuit structure are formed by etching away or removing the portion of the dielectric layer separating the microstrip metal lines and the ground plane from the regions that are not under the lines. The microstrip lines can be fabricated by a subtractive process of etching a metal layer, an additive process of direct laser writing fine lines followed by plating up the lines or a subtractive/additive process in which a trench is etched over a nucleation layer and the wire is electrolytically deposited. Microstrip lines supported on freestanding posts of dielectric material surrounded by air gaps are produced. The average dielectric constant between the lines and ground plane is reduced, resulting in higher characteristic impedance, less crosstalk between lines, increased signal propagation velocities, and reduced wafer stress.

18 Claims, 4 Drawing Sheets

EXPOSE PHOTO RESIST

DEVELOP PHOTORESIST

STAND-OFF TRANSMISSION LINES AND METHOD FOR MAKING SAME

The U.S. Government has rights in this invention pursuant to Contract No. W-7405-ENG-48 between the U.S. Department of Energy and the University of Calif., for the operation of Lawrence Livermore National Laboratory.

This is a continuation of copending application Ser. No. 07/221,395 filed on 07/19/88, now abandoned.

BACKGROUND OF THE INVENTION

The invention relates to microstrip transmission lines in integrated circuits and methods of making same.

In a conventional microstrip transmission line geometry in an integrated circuit structure, a dielectric layer is formed over a ground plane and spaced metal microstrip lines are formed on the dielectric layer. This conventional transmission line geometry, in which the metal lines stand on the entire dielectric plane, has problems of low characteristic impedance due to fringing fields, low signal propagation velocity due to the reduced "speed of light" in the dielectric, and high wafer stress due to thermal expansion mismatch between the dielectric layer and the metal ground plane.

It is desirable to provide a microstrip transmission line geometry with higher characteristic impedance, lower fringing fields, less capacitive coupling and crosstalk, increased signal propagation velocities, and lower wafer stress than presently available. Such an improved microstrip transmission line geometry would greatly enhance integrated circuit performance.

SUMMARY OF THE INVENTION

Accordingly it is an object of the invention to provide an improved microstrip transmission line geometry, and methods for making same.

It is also an object of the invention to provide a microstrip transmission line geometry with higher characteristic impedance and lower fringing fields.

It is another object of the invention to provide a microstrip transmission line geometry with less capacitive coupling and cross talk.

It is a further object of the invention to provide a microstrip transmission line geometry with increased signal propagation velocities.

It is also an object of the invention to provide a microstrip transmission line geometry with lower wafer stress.

The invention is a stand-off transmission line geometry, in which metal microstrip lines stand only on a post of dielectric between the metal and ground plane. The stand-off transmission lines are produced by first forming a dielectric layer on a metal ground plane and forming the metal lines on the dielectric layer (as in the conventional microstrip transmission line geometry). The metal lines can be formed by any suitable process, including a subtractive process using a series of masks to form metal lines from a metal layer, an additive process to deposit very thin metal lines which are then plated up, and a quasi-additive method in which a pattern of trenches is formed to expose a metal surface to nucleate subsequent electrolytic deposition of metal lines. The metal patterns (lines) can be defined using conventional photoresist techniques or laser techniques or any other known method.

The dielectric in the regions outside the metal lines is then removed down to the ground plane so that the only remaining dielectric is a post underneath each metal line. The stand-off lines can be fabricated by reactive ion etching (RIE) of the dielectric using the metal lines as a mask pattern (i.e., a self-aligned process). Alternatively, it may also be desirable or necessary to enhance the selectivity of the etching process by placing another mask of material on top of the metal lines, e.g., carbon. Typically, the dielectric is $SiO_2$, but a polyimide or other dielectric could also be used. Any other dielectric removal process which leaves the dielectric only under the metal lines could be used, e.g. ion milling or other directional etching process.

It is possible to fabricate two or more levels of metal transmission lines by first forming the complete sequence of dielectric layers and metal lines on each dielectric layer and then anisotropically etching the dielectric away. In this process dielectric will be removed only to the topmost metal line so that only regions over which no metal lines cross will be etched down to the ground plane.

The stand-off configuration has four obvious benefits: (1) higher characteristic impedance due to reduced fringing fields, (2) somewhat less crosstalk due to reduced capacitive coupling between lines, (3) increased signal propagation velocities due to the reduced average dielectric constant, and (4) less stress in the wafer from thermal expansion mismatch between the dielectric and the substrate. These effects are highly desirable in computer system applications. The higher characteristic impedance can lead to less attenuation per unit length.

DETAILED DESCRIPTION OF THE INVENTION

Figure 1:
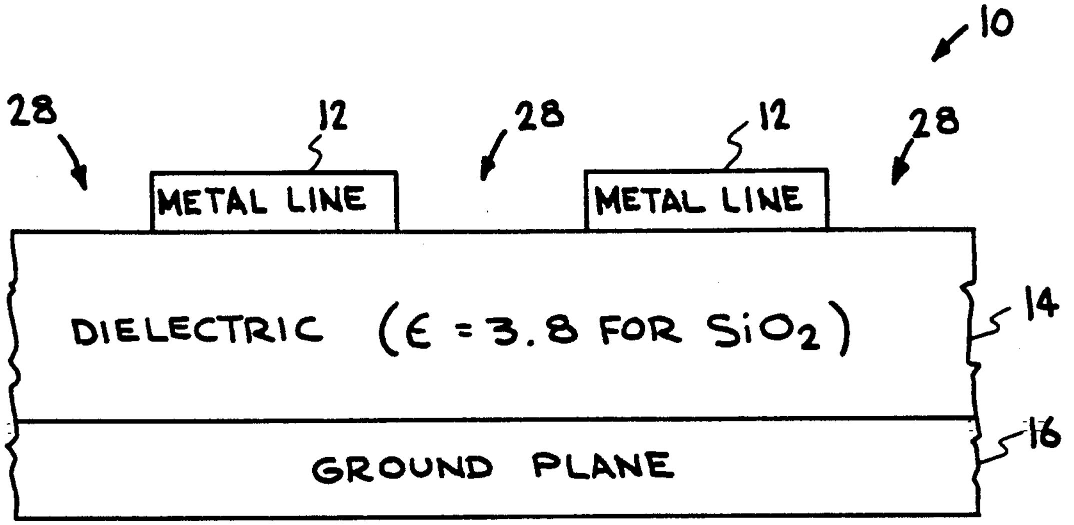
FIG. 1 (PRIOR ART)
FIG. 1 is a sectional view of a prior art microstrip transmission line geometry.

A conventional prior art microstrip transmission line structure 10 is illustrated in FIG. 1. Spaced metal lines 12 are formed on a dielectric layer 14 which separates the metal lines from an underlying metal ground plane 16. The dielectric layer is an entire layer which covers the whole ground plane. For $SiO_2$ the dielectric constant is 3.8; this dielectric constant will thus determine the electrical properties of the transmission line structure.

Figure 2:
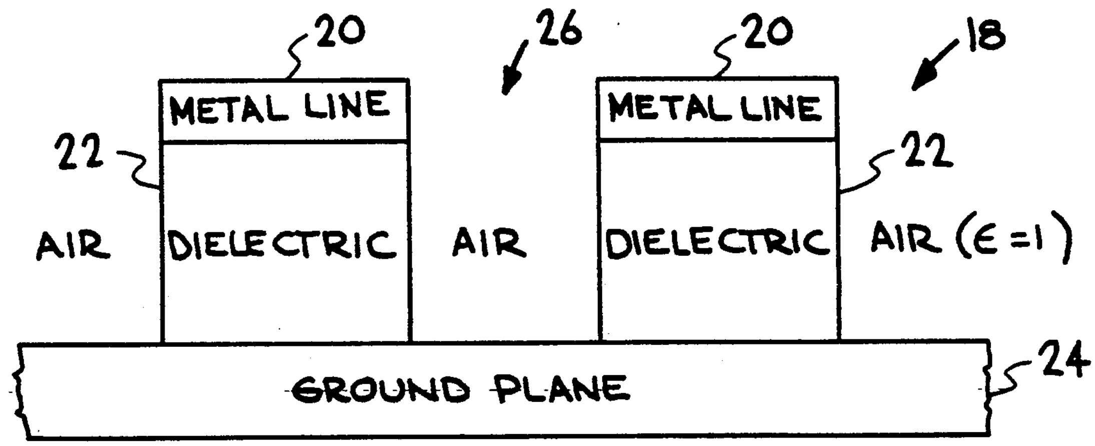
FIG. 2 is a sectional view of a standoff transmission line geometry.

A standoff microstrip transmission line structure 18 according to the invention is illustrated in FIG. 2. Spaced metal microstrip lines 20 stand only on individual posts 22 of dielectric material between the metal lines and metal ground plane 24. The vertical dielectric posts 22 are separated by and define gaps or open regions 26 extending down to the ground plane 24 in the spaces around the metal lines 20. Thus the only dielectric material between the metal lines 20 and ground plane 24 is the vertical walls or posts 22 of width substantially the same as the metal lines 20. The remaining area above the ground plane 24, i.e. gaps or spaces 26, are filled with air, which has a dielectric constant of 1. Thus the combined or average dielectric constant between the metal lines and ground plane will be substantially reduced, and will therefore alter the electrical properties of the transmission line structure.

The standoff transmission line structure 18 is formed by first producing the prior art transmission line structure 10 having a dielectric layer 14 on metal ground plane 16 and metal lines 12 on dielectric layer 14, as was shown in FIG. 1. The metal lines can be formed by a number of different processes as will be further explained below. The metal lines typically have a thickness of about 5 μm and the dielectric layer of about 10 μm. The metal lines are typically about 10–25 μm wide, with 20–40 μm spaces between them. Thus the dielectric layer thickness is from about 40% to 100% of the width of the metal lines. The dielectric in the regions or spaces 28 not directly underneath the metal lines is then directionally removed down to the ground plane so that the only remaining dielectric is under the metal lines, forming the posts 22 separated or surrounded by air gaps 26 as shown in FIG. 2.

The standoff lines can be fabricated by any dielectric removal process that leaves the metal lines on freestanding spaced dielectric posts under the metal lines. The dielectric is typically $SiO_2$, but could be polyimide or other material. A preferred method is reactive ion etching (RIE) of the dielectric. A self-aligned method can be utilized in which the metal lines themselves are used as a mask pattern for the RIE process. Alternatively, for enhanced selectivity of the etching process, another mask of a different material, e.g. carbon, may be placed on top of the metal lines for the RIE process, and later removed (if necessary). Other directional etching processes including ion milling could also be used.

A multilevel transmission line structure, having two or more levels of metal lines, can also be fabricated. After a structure like that of FIG. 1 is produced to form the first level, additional layers of dielectric and metal lines are sequentially formed, producing multilevel transmission lines completely surrounded by solid dielectric over a single ground plane. Only after all the levels have been produced is the etching or removal of dielectric performed. Any underlying metal lines will form an etch stop so that only regions of the ground plane over which no metal lines cross will be exposed. Thus, only the dielectric needed to support the metal lines will remain, with open spaces in the structure down to the topmost metal line at any point in the structure, so that the combined or average dielectric constant will be considerably reduced and the electrical properties of the structure significantly improved.

Prior to etching away the unnecessary dielectric material, metal lines are formed on a dielectric layer. These metal lines can be formed by a number of different processes, including a subtractive process and a quasi-additive or subtractive/additive process. These transmission line fabrication processes can be implemented using laser pantography techniques or with photoresist or by any other known process. Illustrative wire forming processes are flow charted in FIGS. 3 and 4 and the corresponding process steps illustrated in FIGS. 5A–F and 6A–F. These processes produce the metal lines 12 on dielectric layer 14 as shown in FIG. 1.

Figure 3:
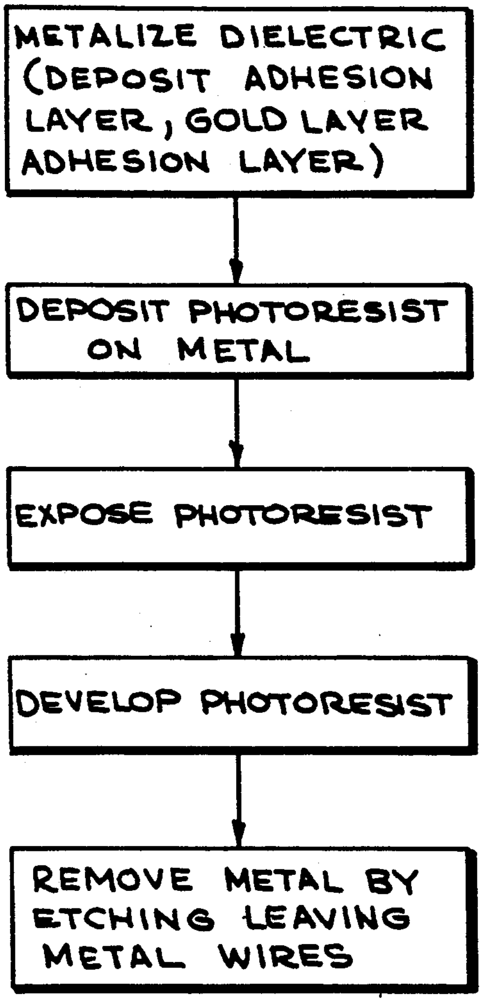
FIG. 3 is a flow chart of a subtractive process for forming metal wires on a substrate using photoresist.

A subtractive process, illustrated in the flow chart of FIG. 3, forms the metal wires using photoresist to pattern a metal layer. The dielectric layer is first metallized, e.g. with approximately 3 μm of gold (over a barrier or adhesion layer, e.g. Ti:W). The metal layer is then coated with photoresist, which can be patterned using conventional techniques. The photoresist layer is exposed using a photolithography mask, and then developed. The unexposed photoresist covers the portion of the metal layer which forms the wires. The photoresist mask is then used to remove the rest of the metal layer by any suitable etching or other process, leaving the metal transmission lines. The remaining photoresist can then be removed.

Figure 4:
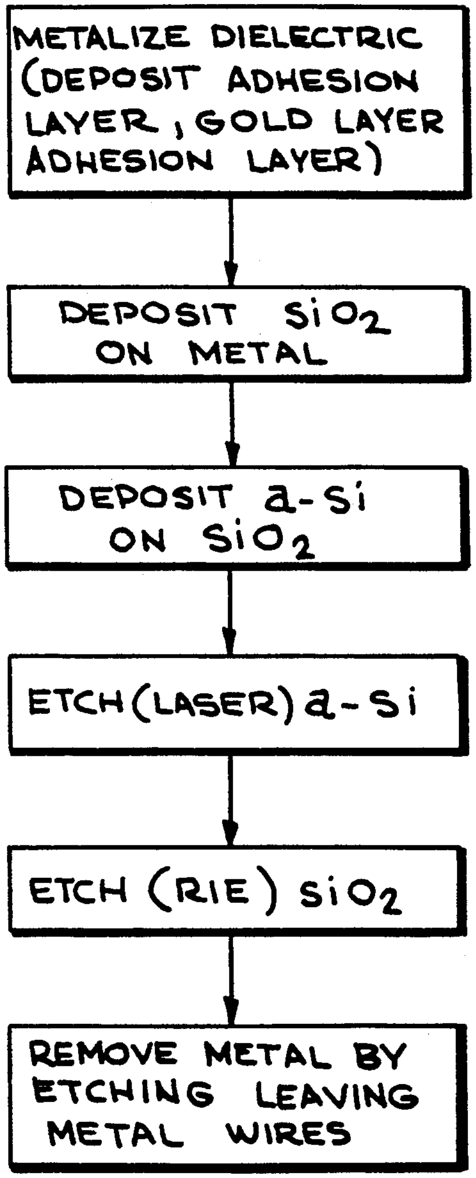
FIG. 4 is a flow chart of a subtractive process for forming metal wires on a substrate using (laser) etching.

An alternative subtractive process, illustrated in the flow chart of FIG. 4, forms the metal wires by a series of etching steps. The dielectric layer is metallized, e.g. with approximately 3 μm of gold (over a barrier or adhesion layer, e.g. Ti:W), then overcoated with at least one mask layer, e.g. with $SiO_2$ and then a-Si. In one specific embodiment, the metal layer is overcoated with approximately 3 μm of $SiO_2$, e.g. using plasma-enhanced chemical vapor deposition (PECVD). The $SiO_2$ is coated with an inorganic mask of amorphous silicon (a-Si) using PECVD; other materials such as carbon could be used. The a-Si/$SiO_2$ laminate is then laser etched and reactive ion etched to generate an inorganic mask for the metallization (to remove all the metal except for the desired wires). The a-Si is locally etched, preferably by a laser, e.g. by irradiating it in a 760-torr chlorine gas ambient with a computer-controlled argon-ion laser beam, acoustooptically scanned at 3 mm/sec and 300 mW power, focused to a 5 μm spot diameter. The etched pattern is transferred to the underlying $SiO_2$ by reactive-ion etching (RIE) or other suitable process such as plasma etching or wet chemical etching. The a-Si mask is then plasma-stripped. The $SiO_2$ pattern is transferred to the gold by ion milling or other etching techniques such as electropolishing, plasma etching or wet chemical etching, removing all metal from undesired areas and leaving the metal wires (transmission lines).

The invention also includes a quasi-additive or subtractive/additive process for forming metal lines using either photoresist or laser patterning. According to the invention the areas where metal is desired are defined by exposing photoresist or by laser etching a pattern to expose a metal surface which is then used to nucleate subsequent electroplating or electroless plating to form a metal line of desired size.

Figure 5A:
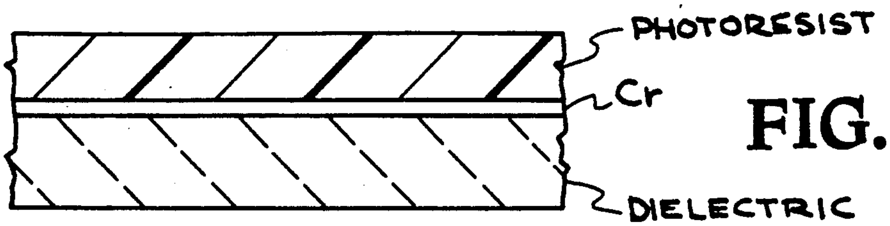
FIGS. 5A–F illustrate the steps of a quasi-additive or subtractive/additive process for forming metal wires on a substrate using photoresist.
Figure 5B:
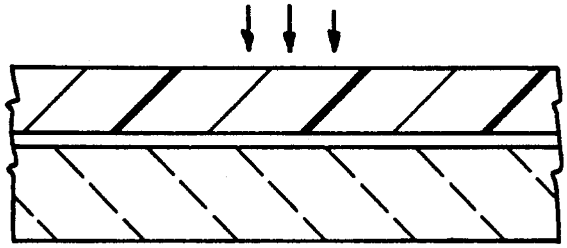
Figure 5C:
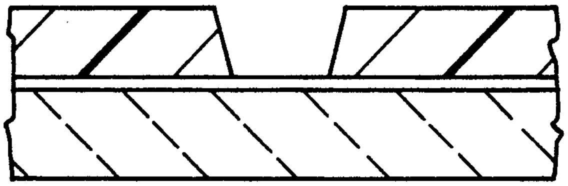
Figure 5D:
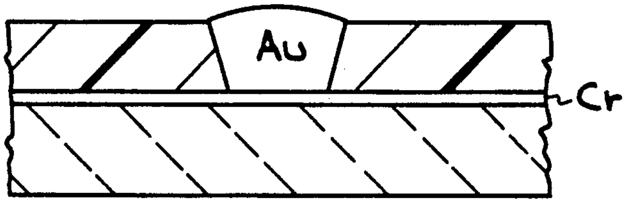
Figure 5E:
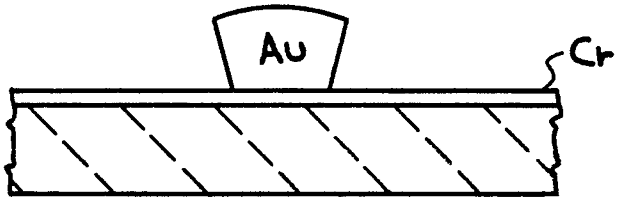
Figure 5F:
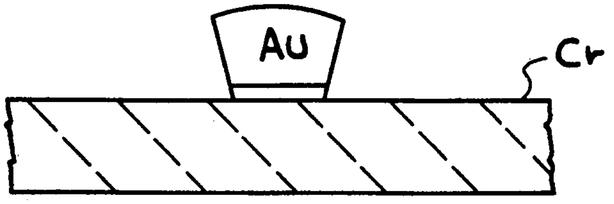

An illustrative process using photoresist to form metal lines is shown in FIGS. 5A–F. First a thin metal layer, e.g. Cr or other suitable metal, is formed on the dielectric substrate, and a layer of photoresist is applied to the Cr, as shown in FIG. 5A. Second, as shown in FIG. 5B, the photoresist is exposed, using suitable masks, in a pattern defining the desired lines. Third, the exposed photoresist is developed, forming a trench which exposes the Cr layer where the lines are desired as shown in FIG. 5C. Fourth, as shown in FIG. 5D, a metal wire is built up using electroplating or electroless plating with the exposed Cr acting as a nucleation site. Typically gold or copper lines can be formed. For the vertical side to be relatively smooth, the photoresist layer must be as thick as the desired line so that the line is conformal. Fifth, after the metal wire has been built up to its desired height, the surrounding photoresist is removed, as shown in FIG. 5E, leaving a metal line on the Cr layer. Finally, as shown in FIG. 5F, the exposed Cr layer surrounding the metal line is etched away, leaving a freestanding metal line formed on the dielectric.

Figure 6A:
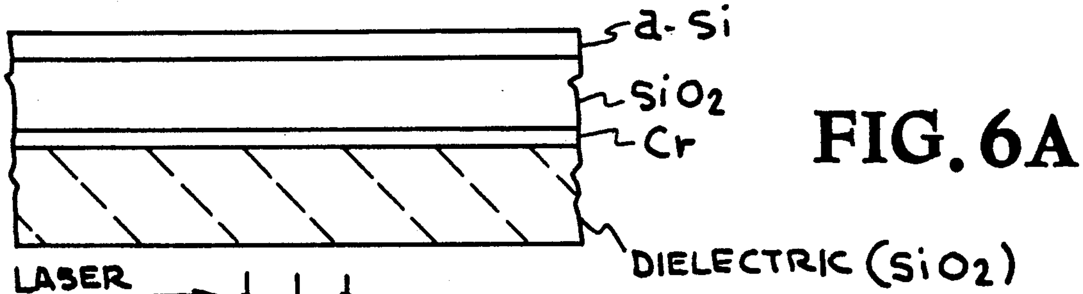
FIGS. 6A–F illustrate the steps of a quasi-additive or subtractive/additive process for forming metal wires on a substrate using (laser) etching.
Figure 6B:
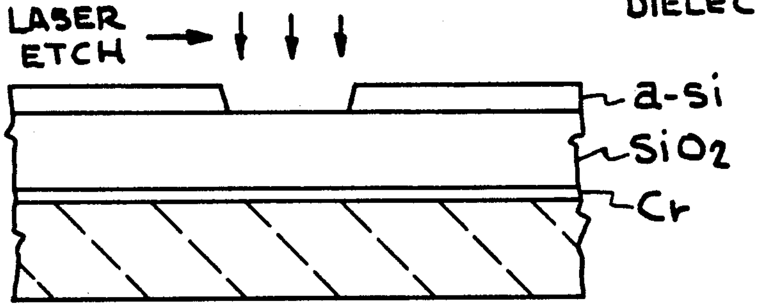
Figure 6C:
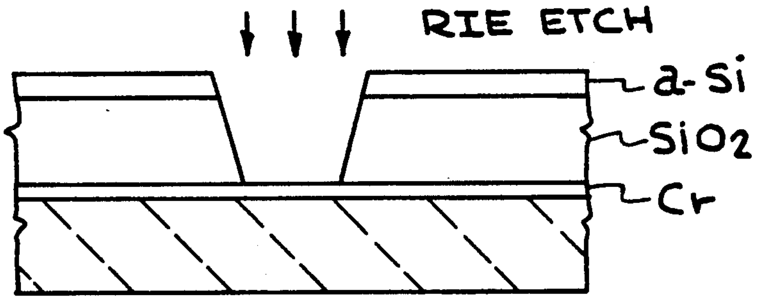
Figure 6D:
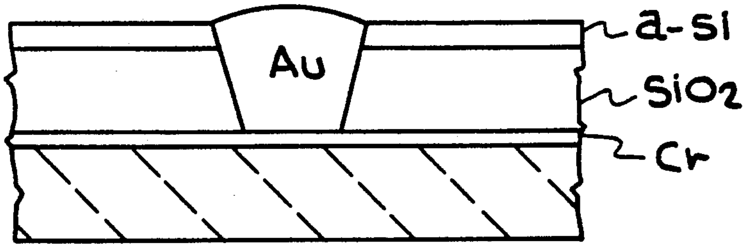
Figure 6E:
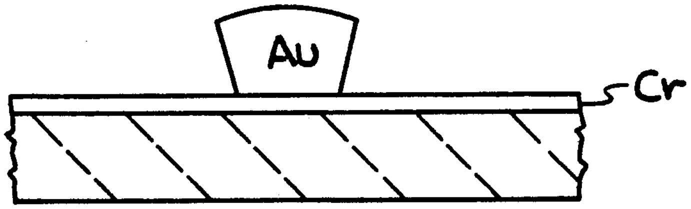
Figure 6F:
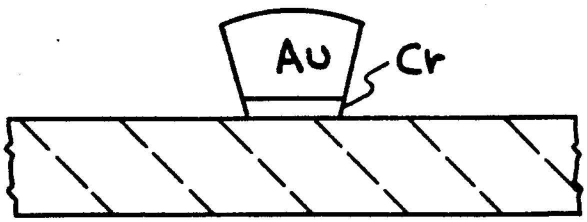

An illustrative specific sequence which could be used to form metal lines using laser patterning techniques is shown in FIGS. 6A–F. In the first step, as shown in FIG. 6A, a series of layers, Cr, $SiO_2$, a-Si, are sequentially formed on the dielectric substrate. Other metals, e.g. Cu, Au, Ti, as well as other dielectric and mask materials could be used. The substrate is the dielectric layer between the lines and ground plane. In step two, as shown in FIG. 6B, the a-Si layer is laser etched in a $Cl_2$ ambient; the laser etch process is a relatively fast process. In the third step, shown in FIG. 6C, the laser-etched a-Si layer is used as a mask to wet chemical etch, plasma etch or reactive ion etch (RIE) the $SiO_2$ layer, using the Cr layer as an etch stop. Thus, a trench is formed down to the Cr layer which corresponds to the desired metal line position. In step four, as shown in FIG. 6D, a metal wire is built up using electroless plating or electroplating with the exposed Cr at the bottom of the trench serving as a nucleation site. Typically gold or copper lines can be formed. For the vertical side to be relatively smooth, the a-Si/$SiO_2$ layer must be as thick as the desired line so that the line is conformal. In step five, as shown in FIG. 6E, once the metal wire has been built up to its desired height, the surrounding a-Si and $SiO_2$ layers are plasma etched away, leaving a metal line standing on the Cr layer. In the sixth and final step, shown in FIG. 6F, the exposed Cr layer surrounding the metal line is etched away leaving a free standing metal line formed on the dielectric substrate.

Changes and modifications in the specifically described embodiments can be carried out without departing from the scope of the invention which is intended to be limited only by the scope of the appended claims.

I claim:

1. A method of forming transmission lines in an integrated circuit structure having a metal ground plane, comprising:
   - forming a dielectric layer on the ground plane;
   - forming at least one microstrip transmission line on the dielectric layer, the dielectric layer having a thickness of at least about 40% of the width of a transmission line;
   - removing the dielectric layer from regions outside each line to form a standoff line supported on a post of dielectric material underneath each line with the post of dielectric material surrounded by open gaps.

2. The method of claim 1 comprising removing the dielectric layer down to the ground plane.

3. The method of claim 1 comprising removing the dielectric layer by directional etching.

4. The method of claim 3 comprising removing the dielectric layer by reactive ion etching.

5. The method of claim 3 further comprising coating each microstrip line with a mask material to form a mask for etching the dielectric layer.

6. The method of claim 5 comprising coating each line with carbon.

7. The method of claim 1 comprising forming the dielectric layer of $SiO_2$ or polyimide.

8. The method of claim 1 comprising forming the dielectric layer with a thickness of about 10 microns.

9. The method of claim 1 further comprising forming additional dielectric layers and forming transmission lines on the additional layers prior to removing dielectric material to form a multilevel transmission line structure.

10. The method of claim 1 wherein the microstrip lines are formed by:
   - depositing in sequence on the dielectric layer a metal layer and at least one mask layer on the metal layer;
   - patterning the at least one mask layer to selectively expose areas where metal lines are desired;
   - forming metal lines by electrolytically depositing metal using the exposed areas of the metal layer as a nucleation site;
   - removing the remaining parts of the at least one mask layer down to the metal layer;
   - removing the exposed metal layer surrounding the metal lines.

11. The method of claim 10 comprising:
   - forming the at least one mask layer of amorphous silicon on $SiO_2$;
   - patterning the amorphous silicon layer by laser etching;
   - patterning the $SiO_2$ layer by wet chemical etching, plasma etching or reactive ion etching;
   - forming the metal lines by electroless plating or electroplating.

12. The method of claim 10 comprising:
   - forming the at least one mask layer of a layer of photoresist;
   - patterning the at least one mask layer by exposing and developing the photoresist;
   - forming the metal lines by electroless plating or electroplating.

13. The method of claim 1 wherein the microstrip lines are fabricated by:
   - forming very thin metal wires on the dielectric layer;
   - plating metal onto the thin wires to increase wire size and reduce resistance.

14. The method of claim 1 wherein the microstrip lines are fabricated by:
   - depositing in sequence a metal layer and at least one mask layer on the metal layer;
   - patterning the at least one mask layer to form a mask on the metal layer;
   - removing metal from the metal layer using the mask to leave freestanding metal lines.

15. The method of claim 14 comprising:
   - forming the at least one mask layer of an amorphous silicon layer on top of a dielectric layer;
   - patterning the amorphous silicon layer by laser etching;
   - patterning the dielectric layer by reactive ion etching, plasma etching or wet chemical etching;
   - removing metal from the metal layer by ion milling, electropolishing, plasma etching or wet chemical etching.

16. The method of claim 1, the dielectric layer having a thickness of up to about 100% of the width of the transmission line.

17. The method of claim 8 comprising forming each transmission line with a width of about 10 microns to about 25 microns.

18. The method of claim 14 comprising:
   - forming the at least one mask layer of a layer of photoresist;
   - patterning the at least one mask layer by exposing and developing the photoresist;
   - removing the metal from the metal layer by ion milling, electropolishing, plasma etching or wet chemical etching.

* * * * *